United States Patent [19]

Horowitz

[11] Patent Number: 5,304,536

[45] Date of Patent: Apr. 19, 1994

[54] PROCESS FOR MAKING SUPERCONDUCTOR POWDER

[75] Inventor: Harold S. Horowitz, Wilmington, Del.

[73] Assignee: E. I. Du Pont de Nemours and Company, Wilmington, Del.

[21] Appl. No.: 725,147

[22] Filed: Jul. 9, 1991

Related U.S. Application Data

[60] Division of Ser. No. 197,961, May 31, 1988, Pat. No. 5,061,683, which is a continuation-in-part of Ser. No. 59,848, Jun. 9, 1987, abandoned.

[51] Int. Cl.$^5$ ............................................. H01L 39/12
[52] U.S. Cl. ................................. 505/445; 264/5; 264/13; 505/734; 505/737; 505/441
[58] Field of Search ............... 505/1, 734, 737, 738, 505/782, 783, 725; 264/5, 12, 13; 423/23, 87, 111, 263

[56] References Cited

U.S. PATENT DOCUMENTS

| | | | |
|---|---|---|---|
| 4,959,347 | 9/1990 | Kobayashi et al. | 505/1 |
| 5,019,555 | 5/1991 | Chin et al. | 505/1 |
| 5,021,400 | 6/1991 | Block et al. | 505/1 |
| 5,039,654 | 8/1991 | Mizuta et al. | 505/734 |

OTHER PUBLICATIONS

Oesterreicher et al. "Superconductivity in Bi-Cu-Sr-Ca-O" *Materials Letters* vol. 6, No. 8.9 p. 254 May 1988.
Cheetham et al. "Control of Copper Valence in $Bi_2Sr_{2-x}CaCu_2O_8$" *Nature* vol. 333 May 1988.
Hazen et al. "100-K Superconducting Phases in the Ti-Ca-Ba-Cu-O System" *Physical Review Letters* vol. 60, No. 16 Apr. 18, 1988.
Subramanian et al. "Crystal Structure of the High-Temperature Superconductor $Tl_2Ba_2CaCu_2O_8$" *Nature* vol. 332 Mar. 31, 1988.

*Primary Examiner*—Jan H. Silbaugh
*Assistant Examiner*—Christopher A. Fiorilla

[57] ABSTRACT

An improved process for preparing a superconducting composition having the formula $M_wA_zCu_vO_x$ wherein M is selected from the group consisting of Bi, Tl, Y, Nd, Sm, Eu, Gd, Dy, Ho, Er, Tm Yb and Lu; A is at least one alkaline earth metal selected from the group consisting of Ba, Ca and Sr; x is at least 6; w is at least 1; z is at least 2 and v is at least 1; said composition having a superconducting transition temperature of above 77K, preferably above about 90 K; said process consisting essentially of (a) forming a suspension having an M:A:Cu atomic ratio of w:z:v by mixing $A(OH)_2$, AO or $AO_2$ and $M_2O_3$ with an aqueous solution of cupric carboxylate or cupric nitrate at a temperature from about 50° C. to about 100° C., or mixing $A(OH)_2$ with an aqueous solution of Cu carboxylate, nitrate or a mixture thereof and M carboxylate, nitrate or a mixture thereof at a temperature from about 50° C. to about 100° C.; (b) drying the suspension formed in step (a) to obtain a precursor powder; and (c) heating and cooling the powder under specified conditions to form the desired superconducting composition which can be formed into shaped articles.

20 Claims, No Drawings

PROCESS FOR MAKING SUPERCONDUCTOR POWDER

CROSS-REFERENCE TO RELATED APPLICATION

This application is a divisional application of patent application Ser. No. 07/197,961 filed May 31, 1988, now U.S. Pat. No. 5,061,683 which is a continuation-in-part application of Ser. No. 059,848 filed on Jun. 9, 1987 now abandoned.

BACKGROUND OF THE INVENTION

1. Field of the Invention

This invention relates to an improved process for making copper oxide-containing superconductors.

2. Description of Related Art

Bednorz and Muller, *Z. Phys.* B64, 189–193 (1986), disclose a superconducting phase in the La-Ba-Cu-O system with a superconducting transition temperature of about 35 K. Samples were prepared by a coprecipitation method from aqueous solutions of Ba-, La- and Cu-nitrate in their appropriate ratios. An aqueous solution of oxalic acid was used as the precipitant.

Chu et al., *Phys. Rev. Lett.* 58, 405–407 (1987), report detection of an apparent superconducting transition with an onset temperature above 40 K under pressure in the La-Ba-Cu-O compound system synthesized directly from a solid-state reaction of $La_2O_3$, CuO and $BaCO_3$ followed by a decomposition of the mixture in a reduced atmosphere. Chu et al., *Science* 235, 567–569 (1987), disclose that a superconducting transition with an onset temperature of 52.5 K has been observed under hydrostatic pressure in compounds with nominal compositions given by $(La_{0.9}Ba_{0.1})_2CuO_{4-y}$, where y is undetermined. They state that the $K_2NiF_4$ layer structure has been proposed to be responsible for the high-temperature superconductivity in the La-Ba-Cu-O system (LBCO). They further state that, however, the small diamagnetic signal, in contrast to the presence of up to 100% $K_2NiF_4$ phase in their samples, raises a question about the exact location of superconductivity in LBCO.

Cava et al., *Phys. Rev. Lett.* 58, 408–410 (1987), disclose bulk superconductivity at 36 K in $La_{1.8}Sr_{0.2}CuO_4$ prepared from appropriate mixtures of high purity La-$(OH)_3$, $SrCO_3$ and CuO powders, heated for several days in air at 1000° C. in quartz crucibles. Rao et al., *Current Science* 56, 47–49 (1987), discuss superconducting properties of compositions which include $La_{1.8}Sr_{0.2}CuO_4$, $La_{1.85}Ba_{0.15}CuO_4$, $La_{1.8}Sr_{0.1}CuO_4$, $(La_{1-x}Pr_x)_2-_ySr_yCuO_4$, and $(La_{1.75}Eu_{0.25})Sr_{0.2}CuO_4$.

Bednorz et al., *Europhys. Lett.* 3, 379–384 (1987), report that susceptibility measurements support high-$T_c$ superconductivity in the Ba-La-Cu-O system. In general, in the La-Ba-Cu-O system, the superconducting phase has been identified as the composition $La_{1-x}(Ba,Sr,Ca)_xCuO_{4-y}$ with the tetragonal $K_2NiF_4$-type structure and with x typically about 0.15 and y indicating oxygen vacancies.

Wu et al., *Phys. Rev. Lett.* 58, 908–910 (1987), disclose a superconducting phase in the Y-Ba-Cu-O system with a superconducting transition temperature between 80 and 93 K. The compounds investigated were prepared with nominal composition $(Y_{1-x}Ba_x)_2CuO_{4-y}$ and x=0.4 by a solid-state reaction of appropriate amounts of $Y_2O_3$, $BaCO_3$ and CuO in a manner similar to that described in Chu et al., *Phys. Rev. Lett.* 58, 405–407 (1987). Said reaction method comprises more specifically heating the oxides in a reduced oxygen atmosphere of $2 \times 10^{-5}$ bars (2 Pa) at 900° C. for 6 hours. The reacted mixture was pulverized and the heating step was repeated. The thoroughly reacted mixture was then pressed into 3/16 inch (0.5 cm) diameter cylinders for final sintering at 925° C. or 24 hours in the same reduced oxygen atmosphere. The material prepared showed the existence of multiple phases.

Hor et al., *Phys. Rev. Lett.* 58, 911–912 (1987), disclose that pressure has only a slight effect on the superconducting transition temperature of the Y-Ba-Cu-O superconductors described by Wu et al., supra.

Sun et al., *Phys. Rev. Lett.* 58, 1574–1576 (1987), disclose the results of a study of Y-Ba-Cu-O samples exhibiting superconductivity with transition temperatures in the 90 K range. The samples were prepared from mixtures of high-purity $Y_2O_3$, $BaCO_3$ and CuO powders. The powders were premixed in methanol or water and subsequently heated to 100° C. to evaporate the solvent. Two thermal heat treatments were used. In the first, the samples were heated in Pt crucibles for 6 hours in air at 850° C. and then for another 6 hours at 1000° C. After the first firing, the samples were a dark-green powder, and after the second firing, they became a very porous, black solid. In the second method, the powders were heated for 8–10 hours at 1000° C., ground and then cold pressed to form disks of about 1 cm diameter and 0.2 cm thickness. The superconducting properties of samples prepared in these two ways were similar. X-ray diffraction examination of the samples revealed the existence of multiple phases.

Cava et al., *Phys. Rev. Lett.* 58, 1676–1679 (1987), have identified this superconducting Y-Ba-Cu-O phase to be orthorhombic, distorted, oxygen-deficient perovskite $YBa_2Cu_3O_{9-\delta}$ where $\delta$ is about 2.1, and have presented the X-ray diffraction powder pattern and lattice parameters for the phase. The single-phase $YBa_2Cu_3O_{9-\delta}$ was prepared in the following manner. $BaCO_3$, $Y_2O_3$ and CuO were mixed, ground and then heated at 950° C. in air for 1 day. The material was then pressed into pellets, sintered in flowing $O_2$ for 16 hours and cooled to 200° C. in $O_2$ before removal from the furnace. Additional overnight treatment in $O_2$ at 700° C. was found to improve the observed properties.

Takita et al., *Jpn. J. Appl. Phys.* 26, L506–L507 (1987), disclose the preparation of several Y-Ba-Cu compositions with superconducting transitions around 90 K by a solid-state reaction method in which a mixture of $Y_2O_3$, CuO, and $BaCO_3$ was heated in an oxygen atmosphere at 950° C. for more than 3 hours. The reacted mixture was pressed into 10 mm diameter disks for final sintering at 950° or 1000° C. for about 3 hours in the same oxygen atmosphere.

Takabatake et al., *Jpn. J. Appl. Phys.* 26, L502–L503 (1987), disclose the preparation of samples of $Ba_{1-x}Y_xCuO_{3-z}$ (x=0.1, 0.2, 0.25, 0.3, 0.4, 0.5, 0.6, 0.8 and 0.9) from the appropriate mixtures of $BaCO_3$, $Y_2O_3$ and CuO. The mixture was pressed into a disc and sintered at 900° C. for 15 hours in air. The sample with x=0.4 exhibited the sharpest superconducting transition with an onset near 96 K.

Syono et al., *Jpn. J. Appl. Phys.* 26, L498–L501 (1987), disclose the preparation of samples of superconducting $Y_{0.4}Ba_{0.6}CuO_{2.22}$ with $T_c$ higher than 88 K by firing mixtures of 4N $Y_2O_3$, 3N $BaCO_3$ and 3N CuO in the desired proportions. The mixtures were prefired at 1000° C. for 5 hours. They were ground, pelletized and sintered at 900° C. for 15 hours in air and cooled to room temperature in the furnace. They also disclose that almost equivalent results were also obtained by starting from concentrated nitrate solution of 4N $Y_2O_3$, GR grade $Ba(NO_3)_2$ and $Cu(NO_3)_2$.

Takayama-Muromachi et al., *Jpn. J. Appl. Phys.* 26, L476-L478 (1987), disclose the preparation of a series of samples to try to identify the superconducting phase in the Y-Ba-Cu-O system. Appropriate amounts of $Y_2O_3$, $BaCO_3$ and CuO were mixed in an agate mortar and then fired at $1173\pm2$ K for 48-72 hours with intermediate grindings. X-ray diffraction powder patterns were obtained. The suggested composition of the superconducting compound is $Y_{1-x}Ba_xCuO_y$ where $0.6 < x < 0.7$.

Hosoya et al., *Jpn. J. Appl. Phys.* 26, L456-L457 (1987), disclose the preparation of various superconductor compositions in the L-Ba-Cu-O systems where L=Tm, Er, Ho, Dy, Eu and Lu. Mixtures of the proper amounts of the lanthanide oxide (99.9% pure), CuO and $BaCO_3$ were heated in air. The obtained powder specimens were reground, pressed into pellets and heated again.

Hirabayashi et al., *Jpn. J. Appl. Phys.* 26, L454-L455 (1987), disclose the preparation of superconductor samples of nominal composition $Y_1Ba_2CuO_{3-x}$ by coprecipitation from aqueous nitrate solution. Oxalic acid was used as the precipitant and insoluble Ba, Y and Cu compounds were formed at a constant pH of 6.8. The decomposition of the precipitate and the solid-state reaction were performed by firing in air at 900° C. for 2 hours. The fired products were pulverized, cold-pressed into pellets and then sintered in air at 900° C. for 5 hours. The authors found that the sample was of nearly single phase having the formula $Y_1Ba_2Cu_3O_7$. The diffraction pattern was obtained and indexed as having tetragonal symmetry.

Ekino et al., *Jpn. J. Appl. Phys.* 26, L452-L453 (1987), disclose the preparation of a superconductor sample with nominal composition $Y_{1.1}Ba_{0.9}CuO_{4-y}$. A prescribed amount of powders of $Y_2O_3$, $BaCO_3$ and CuO was mixed for about an hour, pressed under 6.4 ton/cm² (14 MPa) into pellet shape and sintered at 1000° C. in air for 3 hours.

Akimitsu et al., *Jpn. J. Appl. Phys.* 26, L449-L451 (1987), disclose the preparation of samples with nominal compositions represented by $(Y_{1-x}Ba_x)_2CuO_{4-y}$. The specimens were prepared by mixing the appropriate amounts of powders of $Y_2O_3$, $BaCO_3$ and CuO. The resulting mixture was pressed and heated in air at 1000° C. for 3 hours. Some samples were annealed at appropriate temperatures in $O_2$ or $CO_2$ for several hours. The authors noted that there seemed to be a tendency that samples annealed in $O_2$ showed a superconducting transition with a higher onset temperature but a broader transition than non-annealed samples.

Semba et al., *Jpn. J. Appl. Phys.* 26, L429-L431 (1987), disclose the preparation of samples of $Y_xBa_{1-x}CuO_{4-d}$ where x=0.4 and x=0.5 by the solid state reaction of $BaCO_3$, $Y_2O_3$ and CuO. The mixtures are heated to 950° C. for several hours, pulverized, and then pressed into disk shape. This is followed by the final heat treatment at 1100° C. in one atmosphere $O_2$ gas for 5 hours. The authors identified the phase that exhibited superconductivity above 90 K as one that was black with the atomic ratio of Y:Ba:Cu of 1:2:3. The diffraction pattern was obtained and indexed as having tetragonal symmetry.

Hatano et.al., *Jpn. J. Appl. Phys.* 26, L374-L376 (1987), disclose the preparation of the superconductor compound $Ba_{0.7}Y_{0.3}Cu_1O_x$ from the appropriate mixture of $BaCO_3$ (purity 99.9%), $Y_2O_3$ (99.99%) and CuO (99.9%). The mixture was calcined in an alumina boat heated at 1000° C. for 10 hours in a flowing oxygen atmosphere. The color of the resulting well-sintered block was black.

Hikami et al., *Jpn. J. Appl. Phys.* 26, L347-L348 (1987), disclose the preparation of a Ho-sa-Cu oxide, exhibiting the onset of superconductivity at 93 K and the resistance vanishing below 76 K, by heating a mixture of powders $Ho_2O_3$, $BaCO_3$ and CuO with the composition Ho:Ba:Cu=0.246:0.336:1 at 850° C. in air for two hours. The sample was then pressed into a rectangular shape and sintered at 800° C. for one hour. The sample looked black, but a small part was green.

Matsushita et al., *Jpn. J. Appl. Phys.* 26, L332-L333 (1987), disclose the preparation of $Ba_{0.5}Y_{0.5}Cu_1O_x$ by mixing appropriate amounts of $BaCO_3$ (purity 99.9%), $Y_2O_3$ (99.99%) and CuO (99.9%). The mixture was calcined at 1000° C. for 11 hours in a flowing oxygen atmosphere. The resultant mixture was then pulverized and cold-pressed into disks. The disks were sintered at 900° C. for 4 hours in the same oxygen atmosphere. The calcined powder and disks were black. A superconducting onset temperature of 100 K was observed.

Maeno et al., *Jpn. J. Appl. Phys.* 26, L329-L331 (1987), disclose the preparation of various Y-Ba-Cu oxides by mixing powders of $Y_2O_3$, $BaCO_3$ and CuO, all 99.99% pure, with a pestle and mortar. The powders were pressed at 100 kgf/cm² ($98 \times 10^4$ Pa) for 10-15 minutes to form pellets with a diameter of 12 mm. The pellets were black. The heat treatment was performed in two steps in air. First, the pellets were heated in a horizontal, tubular furnace at 800° C. for 12 hours before the heater was turned off to cool the pellets in the furnace. The pellets were taken out of the furnace at about 200° C. About half the samples around the center of the furnace turned green in color, while others away from the center remained black. The strong correlation with location suggested to the authors that this reaction occurs critically at about 800° C. The pellets were then heated at 1200° C. for 3 hours and then allowed to cool. Pellets which turned light green during the first heat treatment became very hard solids whereas pellets which remained black in the first heat treatment slightly melted or melted down. Three of the samples exhibited an onset of superconductivity above 90 K.

Iguchi et al., *Jpn. J. Appl. Phys.* 26, L327-L328 (1987), disclose the preparation of superconducting $Y_{0.8}Ba_{1.2}CuO_y$ by sintering a stoichiometrical mixture of $Y_2O_3$, $BaCO_3$ and CuO at 900° C. and at 1000° C. in air.

Hosoya et al., *Jpn. J. Appl. Phys.* 26, L325-L326 (1987), disclose the preparation of various superconducting specimens of the L-M-Cu-O systems where L=Yb, Lu, Y, La, Ho and Dy and M=Ba and a mixture of Ba and Sr by heating the mixtures of appropriate amounts of the oxides of the rare earth elements (99.9% pure), CuO, $SrCO_3$ and/or $BaCO_3$ in air at about 900° C. Green powder was obtained. The powder samples were pressed to form pellets which were heated in air until the color became black.

Takagi et al., *Jpn. J. Appl. Phys.* 26, L320-L321 (1987), disclose the preparation of various Y-Ba-Cu oxides by reacting mixtures containing the prescribed amounts of powders of $Y_2O_3$, $BaCO_3$ and CuO at 1000° C., remixing and heat-treating at 1100° C. for a few to several hours. An onset temperature of superconductivity at 95 K or higher was observed for a specimen with the nominal composition of $(Y_{0.9}Ba_{0.1})CuO_y$.

Hikami et al., Jpn. J. Appl. Phys. 26, L314–L315 (1987), disclose the preparation of compositions in the Y-Ba-Cu-O system by heating the powders of $Y_2O_3$, $BaCO_3$ and CuO to 800° C. or 900° C. in air for 2–4 hours, pressing into pellets at 4 kbars ($4 \times 10^5$ Pa) and reheating to 800° C. in air for 2 hours for sintering. The samples show an onset of superconductivity at 85 K and a vanishing resistance at 45 K.

Bourne et al., Phys. Letters A 120, 494–496 (1987), disclose the preparation of Y-Ba-Cu-O samples of $Y_{2-x}Ba_xCuO_4$ by pressing finely ground powders of $Y_2O_3$, $BaCO_3$ and CuO into pellets and sintering the pellets in an oxygen atmosphere at 1082° C. Superconductivity for samples having x equal to about 0.8 was reported.

Moodenbaugh et al., Phys. Rev. Lett. 58, 1885–1887 (1987), disclose superconductivity near 90 K in multi-phase samples with nominal composition $Lu_{1.8}Ba_{0.2}CuO_4$ prepared from dried $Lu_2O_3$, high-purity $BaCP_3$ ($BaCO_3$ presumably), and fully oxidized CuO. These powders were ground together in an agate mortar and then fired overnight in air at 1000° C. in Pt crucibles. This material was ground again, pelletized, and then fired at 1100° C. in air for 4–12 hours in Pt crucibles. Additional samples fired solely at 1000° C. and those fired at 1200° C. show no signs of superconductivity.

Hor et al., Phys. Rev. Lett. 58, 1891–1894 (1987), disclose superconductivity in the 90 K range in $ABa_2Cu_3O_{6+x}$ with A=La, Nd, Sm, Eu, Gd, Ho, Er, and Lu in addition to Y. The samples were synthesized by the solid-state reaction of appropriate amounts of sesquioxides of La, Nd, Sm, Eu, Gd, Ho, Er, and Lu, $BaCO_3$ and CuO in a manner similar to that described in Chu et al., Phys. Rev. Lett. 58, 405 (1987) and Chu et al., Science 235, 567 (1987).

Morgan, "Processing of Crystalline Ceramics, Palmoor et al., eds., Plenum Press, New York, 67–76 (1978), in discussing chemical processing for ceramics states that where direct synthesis is not immediately achieved, the use of co-precipitation, even if not completely homogeneous on a molecular scale is so vastly superior for uniform powder preparation to the use of ball milled oxides, that it should be the method of choice. He further discusses conditions for preparing perovskites or potassium nickel fluoride type structures using the oxides of Ca, Sr, Li, lanthanides, etc. and hot solutions of transition metal nitrates and acetates.

C. Michel et al., Z. Phys. B - Condensed Matter 68, 421 (1987), disclose a novel family of superconducting oxides in the Bi-Sr-Cu-O system with composition close to $Bi_2Sr_2Cu_2O_{7+\delta}$. A pure phase was isolated for the composition $Bi_2Sr_2Cu_2O_{7+\delta}$. The X-ray diffraction pattern for this material exhibits some similarity with that of perovskite and the electron diffraction pattern shows the perovskite subcell with the orthorhombic cell parameters of a=5.32 A (0.532 nm), b=26.6 A (2.66 nm) and c=48.8 A (4.88 nm). The material made from ultrapure oxides has a superconducting transition with a midpoint of 22 K as determined from resistivity measurements and zero resistance below 14 K. The material made from commercial grade oxides has a superconducting transition with a midpoint of 7 K. In each case a mixture of $Bi_2O_3$, CuO and $SrCO_3$ was heated at 800° C. for 12 hours in air, sintered at 900° C. for 2 hours in air and quenched to room temperature.

Akimitsu et al., Jpn. J. Appl. Phys. 26, L2080 (1987) disclose a Bi-Sr-Cu-O composition with a superconducting onset temperature of near 8 K made by firing well-dried mixtures of $Bi_2O_3$, $SrCO_3$ and CuO powders at about 880° C. in air for 12 hours.

H. Maeda et al., Jpn. J. Appl. Phys. 27, L209 (1988), disclose a superconducting oxide in the Bi-Sr-Ca-Cu-O system with the composition near $BiSrCaCu_2O_x$ and a superconducting transition temperature $T_c$ of about 105 K. The samples were prepared by calcining a mixture of $Bi_2O_3$, $SrCO_3$, $CaCO_3$, and CuO powders at 800°–870° C. for 5 hours. The material was reground, cold-pressed into pellets at a pressure of 2 ton/cm$^2$, sintered at about 870° C. in air or oxygen and furnace-cooled to room temperature.

The commonly assigned application, "Superconducting Metal Oxide Compositions and Process For Making Them", Ser. No. 153,107, filed Feb. 8, 1988, now abandoned, a continuation-in-part of Ser. No. 152,186, filed Feb. 4, 1988, now abandoned, disclose superconducting compositions having the nominal formula $Bi_aSr_bCa_cCu_3O_x$ wherein a is from about 1 to about 3, b is from about ⅜ to about 4, c is from about 3/16 to about 2 and x=(1.5 a+b+c+y) where y is from about 2 to about 5, with the proviso that b +c is from about 3/2 to about 5, said compositions having superconducting transition temperatures of about 70 K or higher. It also discloses the superconducting metal oxide phase having the formula $Bi_2Sr_{3-z}Ca_zCu_2O_{8+w}$ wherein z is from about 0.1 to about 0.9, preferably 0.4 to 0.8 and w is greater than zero but less than about 1. M. A. Subramanian et al., Science 239, 1015 (1988) also disclose the $Bi_2Sr_{3-z}Ca_zCu_2O_{8+w}$ superconductor and a method for preparing it. Single crystals were grown from a mixture of $Bi_2O_3$, $CaCO_3$, $SrO_2/Sr(NO_3)_2$ and CuO in proportions such that the atomic ratio Bi:Sr:Ca:Cu=2:2:1:3. The mixture was heated to 850° to 900° C., held for 36 hours and cooled at the rate of 1° C. per minute.

L. F. Sohneemeyer et al., Nature 332, 422 (1988), disclose an alkali chloride flux method to grow superconducting single crystals in the Bi-Sr-Ca-Cu-O system. Pre-reacted Bi-Sr-Ca-Cu-O mixtures were prepared from high-purity $Bi_2O_3$, $SrCO_3$, $Ca(OH)_2$, and CuO by slowly heating to 800°–850° C. with intermediate grinding steps. Charges consisting of 10–50 wt % Bi-Sr-Ca-Cu-O mixtures thoroughly mixed with NaCl, KCl or other alkali halide salt or salt mixtures were placed in crucibles, heated above the melting temperature if the salt or salt mixture, and cooled at rates of 1°–10° C. per hour.

S. Kondoh et a)., Solid State Comm. 65, 1329 (1988), disclose a superconductor composition in the Tl-Ba-Cu-O system with an onset of superconductivity as high as 20 K. These superconductors were prepared by heating a mixture of $Tl_2O_3$, BaO and CuO at about 650° C. for 12 hours. The producy was reground, pressed into pellets and heated again at 700° C. for about 20 hours.

Z. Z. Sheng et al., Nature 332, 55 (1988) and Z. Z. Sheng et al., Phys. Rev. Lett. 60, 937 (1988) disclose superconductivity in the Tl-sa-Cu-O system. These samples are reported to have onset temperatures above 90 K and zero resistance at 81 K. The samples were prepared by mixing and grinding appropriate amounts of $BaCO_3$ and CuO with an agate mortar and pestle. This mixture was heated in air at 925° C. for more than 24 hours with several intermediate grindings to obtain a uniform black oxide Ba-Cu oxide powder which was mixed with an appropriate amount of $Tl_2O_3$, completely ground and pressed into a pellet with a diameter of 7 mm and a thickness of 1-2 mm. The pellet was then put into a tube furnace which had been heated to 880°-910° C. and was heated for 2-5 minutes in flowing oxygen. As soon as it had slightly melted, the sample was taken from the furnace and quenched in air to room temperature. It was noted by visual inspection that $Tl_2O_3$ had partially volatilized as black smoke, part had become a light yellow liquid, and part had reacted with Ba-Cu oxide forming a black, partially melted, porous material.

Z. Z. Sheng et al., Nature 332, 138 (1988) disclose superconductivity in the Tl-Ba-Ca-Cu-O system. Samples are reported to have onset temperatures at 120 K and zero resistance above 100 K. The samples were prepared by mixing and grinding appropriate amounts of $Tl_2O_3$, CaO and $BaCuO_4$. This mixture was pressed into a pellet with a diameter of 7 mm and a thickness of 1-2 mm. The pellet was then put into a tube furnace which had been heated to 880°-910° C. and was heated for 3-5 minutes in flowing oxygen. The sample was then taken from the furnace and quenched in air to room temperature.

R. M. Hazen et al., Phys. Rev. Lett. 60, 1657 (1988), disclose two superconducting phases in the Tl-Ba-Ca-Cu-O system, $Tl_2Ba_2Ca_2Cu_3O_{10}$ and $Tl_2Ba_2CaCu_2O_8$ and the method of preparation. Appropriate amounts of $Tl_2O_3$, CaO, and $BaCu_3O_4$ or $Ba_2Cu_3O_4$ were completely mixed, ground and pressed into a pellet. A quartz boat containing the pellet was placed in a tube furnace which had been preheated to 880°-910° C. The sample was heated for 3 to 5 minutes in flowing oxygen and the furnace cooled to room temperature in 1 to 1.5 hours.

Subramanian et al., Nature 332, 420 (1988) disclose the preparation of superconducting phases in the Tl-Ba-Ca-Cu-O system by reacting $Tl_2O_3$, $CaO_2$ or $CaCO_3$, $BaO_2$ and CuO at 850°-910° C. in air or in sealed gold tubes for 15 minutes to 3 hours.

SUMMARY OF THE INVENTION

The present invention provides an improved process for preparing a precursor to a copper oxide-containing superconducting composition. The composition may be of a rare earth metal-, bismuth- or thallium-based alkaline earth metal-copper-oxide composition. The process for preparing the superconducting composition involves heating the precursor and in addition, in the case of the rare earth metal-based compositions, cooling the previously-heated precursor under prescribed conditions. The resulting superconducting powder can be pressed into a desired shape and then, under prescribed conditions, sintered, and for the rare earth metal-based compositions cooled, to provide a superconducting shaped article. This invention also includes providing the shaped articles prepared by the process of the invention.

In its broadest sense, the invention involves preparing the precursor from an aqueous suspension by mixing an aqueous solution of a carboxylate e.g. an acetate or a nitrate of copper at a temperature of 50°-100° C. with either (1) a hydroxide or an oxide or a peroxide of an alkaline earth metal, e.g. barium, calcium or strontium and bismuth oxide ($Bi_2O_3$) or thallium oxide ($Tl_2O_3$) or a rare earth oxide, e.g. $Y_2O_3$, or (2) a hydroxide of the alkaline earth metal and a carboxylate or a nitrate of bismuth, thallium or the rare earth. The relative quantities of the compounds are selected to provide the atomic ratios of M (Bi, Tl or rare earth) -to- A (alkaline earth metal) -to- copper -to- oxygen that are known to provide superconducting compositions, e.g. M(rare earth)$Ba_2Cu_3O_x$ where x is 6.5-7.0, $Bi_2Sr_2CuO_x$ where x is 6-6.5, $Bi_2Sr_2CaCu_2O_x$ where x is 8-9, $Tl_2BA_2CuO_x$ where x is 6-6.5, $Tl_2Ba_2CaO_x$ where x is 8-9, $Tl_2Ba_2Cu_2Cu_3O_x$ where x is 10-11.5.

Thus, the invention as it relates to the rare earth metal-containing superconducting compositions involves a process for preparing a superconducting composition having the formula $MBa_2Cu_3O_x$ wherein M is selected from the group consisting of Y, Nd, Sm, Eu, Gd, Dy, Ho, Er, Tm, Yb and Lu; x is from about 6.5 to about 7.0; said composition having a superconducting transition temperature of about 90 K; said process consisting essentially of (a) mixing $Ba(OH)_2.8H_2O$, BaO or $BaO_2$ and $M_2O_3$ with an aqueous solution of cupric carboxylate or cupric nitrate at a temperature from about 50° C. to about 100° C., or mixing $Ba(OH)_2.8H_2O$ with an aqueous solution of Cu and M carboxylates or nitrates at a temperature from about 50° C. to about 100° C., to obtain a suspension having M:Ba:Cu present in an atomic ratio of about 1:2:3;

(b) drying the suspension formed in step (a) to obtain a powder precursor;

(c) heating said precursor in an oxygen-containing atmosphere at a temperature from about 850° C. to about 950° C. for a time sufficient to form $MBa_2Cu_3O_y$, where y is from about 6.0 to about 6.4; and (d) maintaining the $MBa_2Cu_3O_y$ in an oxygen-containing atmosphere while cooling for a time sufficient to obtain the desired product. The $MBa_2Cu_3O_x$ powder can be pressed into a desired shape and then, under prescribed conditions sintered and cooled to provide a $MBa_2Cu_3O_x$ shaped article.

The invention provides an improved process for preparing a superconducting composition of bismuth-based alkaline earth metal-copper-oxide wherein the alkaline earth metal is Sr or both Sr and Ca;

the process consisting essentially of (a) mixing $Sr(OH)_2.8H_2O$, SrO or $SrO_2$ and, if both Sr and Ca are to be present, $Ca(OH)_2$, CaO or $CaO_2$ and $Bi_2O_3$ with an aqueous solution of cupric carboxylate or cupric nitrate at a temperature from about 50° C. to about 100° C. to obtain a suspension having Bi:Sr:Ca:Cu present in the desired atomic ratio;

(b) drying the suspension formed in step (a) to obtain a powder precursor; and (c) heating said precursor in an oxygen-containing atmosphere at a temperature from about 850° C. to about 875° C. for a time sufficient to form the superconducting oxide.

Preferred is the process in which Bi:Sr:Ca:Cu are in the atomic ratios 2:2:0:1 or 2:2:1:2 and the respective superconducting oxide has the nominal formula $Bi_2Sr_2CuO$ where x is from about 6 to about 6.5 or the nominal formula $Bi_2Sr_2CaCu_2O_x$, where x is from about 8 to about 9, both with orthorhombic symmetry.

The invention also provides an improved process for preparing a superconducting composition of thallium-based alkaline earth metal-copper-oxide wherein the alkaline earth metal is Ba or both Ba and Ca;

the process consisting essentially of (a) mixing $Ba(OH)_2.8H_2O$, BaO or $BaO_2$ and, if both Ba and Ca are to be present, $Ca(OH)_2$, CaO or $CaO_2$ and $Tl_2O_3$ with an aqueous solution of cupric carboxylate or cupric nitrate at a temperature from about 50° C. to about 100° C., or mixing Ba(OH)$_2$.8H$_2$O and, if both Ba and Ca are to be present, Ca(OH)$_2$ with an aqueous solution of Cu and Tl carboxylates or nitrates at a temperature from about 50° C. to about 100° C., to obtain a suspension having Tl:Ba:Ca:Cu present in the desired atomic ratio;

(b) drying the suspension formed in step (a) to obtain a powder precursor; and (c) heating said precursor in an oxygen-containing atmosphere at a temperature from about 850° C. to about 920° C. for a time sufficient to form the superconducting oxide.

Preferred is the process in which Tl:Ba:Ca:Cu are in the atomic ratios 2:2:0:1, 2:2:1:2 or 2:2:2:3 and the respective superconducting oxide has the nominal formula Tl$_2$Ba$_2$CuO$_x$ where x is from about 6 to about 6.5, the nominal formula Tl$_2$Ba$_2$CaCu$_2$O$_x$ where x is from about 8 to about 9 or the nominal formula Tl$_2$Ba$_2$Ca$_2$Cu$_3$O$_x$ where x is from about 10 to about 11.5, all with tetragonal symmetry.

DETAILED DESCRIPTION OF THE INVENTION

The various products of the process of this invention is a nearly single-phase superconducting oxide. No additional grinding, annealing or refining is necessary to produce the superconducting oxide composition.

The use of a suspension to form a very finely divided precursor powder assures a high degree of homogeneity of the reactant cations relative to conventional solid state techniques and results in the preparation of a uniform, nearly single-phase superconducting oxide composition by a process in which this precursor is heated in air or oxygen.

In the process, a suspension is prepared which is then used to generate a precursor powder for later heating. The suspension is prepared by using, as the source of the alkaline earth metal, the alkaline earth metal hydroxide, the alkaline earth metal peroxide or the alkaline earth metal oxide. Preferably, the alkaline earth metal hydroxide is used. To facilitate mixing, particularly when preparing large size batches, the alkaline earth metal hydroxide can be added as an aqueous solution. If the alkaline earth metal peroxide is used, it should be added slowly to the solution of the copper compound because of the evolution of oxygen. The copper compound used in preparing the suspension is an aqueous, preferably concentrated, solution of cupric carboxylate or cupric nitrate. Preferably the source of copper is cupric carboxylate. Suitable carboxylates include the formate, acetate, and other water soluble carboxylates, but the acetate is preferred.

In one embodiment of the invention, the suspension is prepared by mixing either M$_2$O$_3$ as a source of the rare earth metal, Bi$_2$O$_3$ as a source of bismuth, or Tl$_2$O$_3$ as a source of thallium and the alkaline earth metal compound with an aqueous solution of cupric carboxylate or cupric nitrate at a temperature from about 50° C. to about 100° C. Preferably, the rare earth metal, bismuth or thallium compound and the alkaline earth metal compound are mixed together prior to addition to the aqueous solution.

In another embodiment of the invention, the suspension is prepared by mixing the alkaline earth metal compound with an aqueous solution of copper carboxylate, nitrate or a mixture thereof and either a rare earth metal or a thallium carboxylate, nitrate or a mixture thereof at a temperature from about 50° C. to about 100° C. In this embodiment, first as in the previous embodiment, the preferred source of copper is a cupric carboxylate and of these the acetate is preferred. Preferably, the source of the rare earth metal is a rare earth metal carboxylate. Suitable carboxylates include the acetate and other water soluble carboxylates, but the acetate is preferred. This latter embodiment of the invention can also be used to prepare the bismuth-based oxide. However, the low solubilities of the bismuth salts such as bismuth nitrate, bismuth acetate and the other bismuth carboxylates offer no significant advantage regarding homogeneity of the suspension formed over that obtained by using Bi$_2$O$_3$ as in the previous embodiment.

In either embodiment, the concentration of the aqueous solution is below saturation, and heating can be effected before, during or after the solids are added.

The resulting suspension is then dried to remove the solvent and form the powder precursor. Drying can be effected by conventional techniques. For instance, drying can be accomplished by continued heating of the suspension at a temperature from about 50° C. to about 100° C. while the suspension is stirred. As the solvent is removed from the suspension, the viscosity of the suspension increases until a thick paste is formed. This paste is further heated at a temperature from about 100° C. to about 200° C. to produce the precursor solid which is then gently milled to form a powder precursor. Alternatively, the suspension can be spray-dried or freeze-dried using conventional techniques to produce a powder precursor without milling.

The powder precursor can be heated in an oxygen-containing atmosphere at a temperature appropriate for the specific metal-based oxide, where for the rare earth metal-based oxide the temperature is from about 850° C. to about 950° C., for the bismuth-based oxide the temperature is from about 850° C. to about 875° C., and for the thallium-based oxide the temperature is from about 850° C. to about 920° C., for a time sufficient to form the superconducting oxide except in the case of the rare earth metal-based oxide where the product formed is during the heating is maintained in an oxygen-containing atmosphere while cooling for a time sufficient to form the superconducting oxide. For heating, the powder precursor is placed in a non-reactive container, e.g., an alumina or gold crucible or tray.

The superconducting product powder can be pressed into a desired shape and then sintered in an oxygen-containing atmosphere at a temperature as indicated above for the preparation of the specific metal-based oxide, i.e., for the rare earth metal-based oxide the temperature is from about 850° C. to about 950° C., for the bismuth-based oxide the temperature is from about 850° C. to about 875° C., and for the thallium-based oxide the temperature is from about 850° C. to about 920° C., with the proviso that in the case of the rare earth metal-based oxide the shaped article is maintained in an oxygen-containing atmosphere while cooling.

The process of this invention provides a method for preparing a superconducting composition that requires no special atmosphere during the heating step, no subsequent grinding, reheating or annealing, no extended heating times and no refining of the product to separate the desired superconducting composition from other phases.

The product of the process of the invention involving the use of the rare earth metal is essentially a single-phase, superconducting compound with orthorhombic symmetry. No additional grinding, annealing or refining is necessary to produce the $MBa_2Cu_3O_x$ composition. The process of the invention is an improved process for preparing superconducting compositions having the formula $MBa_2Cu_3O_x$, M being selected from the group consisting of Y, Nd, Sm, Eu, Gd, Dy, Ho, Er, Tm, Yb and Lu, preferably Y. The parameter x is from about 6.5 to about 7.0, but is preferably from about 6.8 to 7.0. The use of a suspension to form a precursor powder assures a high degree of mixing of the starting materials relative to conventional solid state techniques and results in the preparation of a uniform, practically single-phase superconducting $MBa_2Cu_3O_x$ composition by a process in which this precusor is heated in air at a temperature of about 850° C. to about 950° C.

In the process of the invention a suspension is prepared which is then used to generate a precursor powder for later heating. The suspension is prepared by using, as the source of barium, $Ba(OH)_2.8H_2O$, $BaO_2$ or BaO. Preferably, $Ba(OH)_2.8H_2O$ is used. If $BaO_2$ is used, it should be added slowly to the Cu solution because of the evolution of oxygen. The second component used in preparing the suspension is an aqueous, preferably concentrated, solution of cupric carboxylate or cupric nitrate. Preferably, the source of copper is cupric carboxylate. Suitable carboxylates include the formate, acetate, and other water soluble cupric carboxylates, but the acetate is preferred. In one embodiment of the invention, the suspension is prepared by mixing $M_2O_3$ and the barium compound with an aqueous solution of cupric carboxylate or cupric nitrate at a temperature from about 50° C. to about 100° C. Preferably, the $M_2O_3$ and barium compound are mixed together prior to addition to the aqueous solution. In another embodiment of the invention, the suspension is prepared by mixing the barium compound with an aqueous solution of Cu carboxylate, nitrate or a mixture thereof and M carboxylate, nitrate or a mixture thereof at a temperature from about 50° C. to about 100° C. In this embodiment he preferred Cu source is the same as for the other embodiment. Preferably, the rare earth metal source is an M carboxylate. Suitable carboxylates include the acetate, and other water-soluble carboxylates, but the acetate is preferred. In either embodiment, the concentration of the aqueous solution is below saturation, and heating of the aqueous solution can be effected before, during or after the solids are added. The relative amounts of the sources of M, Ba and Cu used in forming the suspension from which the precursor is prepared are chosen such that the atomic ratio of M Ba:Cu is about 1:2:3. Preferably, the starting materials used in the process of the invention are of relatively high purity, e.g., 99.9% by weight for copper acetate, 99.99% by weight for copper nitrate, >98% by weight for $Ba(OH)_2.8H_2O$, 99.5% by weight for $BaO_2$ and 99.9% by weight for $M_2O_3$. Less pure starting materials can be used; however, the product may then contain an amount of another phase material comparable to the amount of impurity in the starting materials. It is particularly important to avoid the presence of impurities containing iron and other transition, but non-rare earth, metals in the reactants. The resulting suspension is then dried to remove the solvent and form the powder precursor. Drying can be effected by conventional techniques. For instance, drying can be accomplished by continued heating of the suspension at a temperature from about 50° C. to about 100° C. while the suspension is stirred. As the solvent is removed from the suspension, the viscosity of the suspension increases until a thick paste is formed. This thick paste is further heated at a temperature from about 100° C. to 200° C. to produce the precursor solid which is then gently milled to form a powder precursor. Alternatively, the suspension can be spray dried or freeze-dried using conventional techniques to produce a powder precursor without milling. The powder precursor is then heated in an oxygen-containing atmosphere at a temperature from about 850° C. to about 950° C., preferably from about 875° C. to about 900° C., for a time sufficient to form $MBa_2Cu_3O_y$, where y is from about 6.0 to about 6.4. It has been determined by TGA that when the powder precursor is heated to 900° C., y is from about 6.0 to about 6.4. For heating, the powder precursor is placed in a non-reactive container, e.g., an alumina or gold crucible or tray. The oxygen-containing atmosphere can be air or oxygen gas, but is preferably air. The container with the powder precursor is placed in a furnace and brought to a temperature of about 850° C. to about 950° C. It is the total time that the powder precursor is at temperatures in this range that is important. For example, when a heating rate of 20° C. per minute is used to raise the temperature of the furnace containing the sample from ambient temperature to a final heating temperature is 900° C., $\frac{1}{2}$ to 2 hours at this temperature are sufficient to produce, after cooling as prescribed herein, practically single-phase superconducting $MBa_2Cu_3O_x$. Longer heating times can be used. At the end of the heating time, the furnace is turned off, and the resulting material is allowed to cool in the oxygen-containing atmosphere for a time sufficient to obtain the desired product. Preferably, the material is cooled to below about 100° C. (a time interval of about 4-5 hours) before the sample container is removed from the furnace. During the cooling step, the oxygen content of the material increases to give the desired $MBa_2Cu_3O_x$ product. The additional oxygen which enters into the crystalline lattice of the material during this cooling step to form the desired product does so by diffusion. The rate at which oxygen enters the lattice is determined by a complex function of time, temperature, oxygen content of the atmosphere, sample form, etc. Consequently, there are numerous combinations of these conditions that will result in the desired product. For example, the rate of oxygen uptake by the material at 500° C. in air is rapid, and the desired product can be obtained in less than an hour under these conditions when the sample is in the form of a loosely packed, fine particle powder. However, if the sample is in the form of larger particles, or densely packed powders, the times required to obtain the desired product at 500° C. in air will increase. The $MBa_2Cu_3O_x$ powder can be pressed into a desired shape, sintered in an oxygen-containing atmosphere at a temperature from about 900° C. to about 950° C., and maintained in the oxygen-containing atmosphere while cooling as prescribed above to obtain a $MBa_2Cu_3O_x$ shaped article. Well sintered, shaped articles will take longer to form the desired product while cooling than will more porous ones, and for larger, well sintered, shaped articles many hours may be required. A convenient procedure for obtaining the desired product when the material is in the form of a powder or a small shaped object is to turn off the furnace in which the heating was conducted and to allow the material to cool in the furnace to a temperature approaching ambient (about 22° C.) which typically requires a few hours. In the examples, cooling in the furnace to below about 100° C. was found to be sufficient. Increasing the partial pressure of oxygen in the atmosphere surrounding the sample during cooling increases the rate at which oxygen enters the lattice. If, in a particular experiment, the material is cooled in such a manner that the $MBa_2Cu_3O_x$ product is not obtained, the material can be heated to an intermediate temperature, such as 500° C., between ambient temperature and the final temperature used in the heating step and held at this temperature for a sufficient time to obtain the desired product.

The product formed is practically single-phase and has orthorhombic symmetry as determined by X-ray diffraction measurements.

The process of this invention as it relates to the rare earth metal superconductor provides a method for preparing a superconducting $MBa_2Cu_3O_x$ composition that does not require a special atmosphere during the heating step, subsequent grinding, reheating or annealing, extended heating times or refining of the product to separate the desired superconducting $MBa_2Cu_3O_x$ composition from other phases.

As used herein the phrase "consisting essentially of" means that additional steps can be added to the process of the Invention so long as such steps do not materially alter the basic and novel characteristics of the invention. The presence of superconductivity at any given temperature can be determined by the Meissner effect, i.e., the exclusion of magnetic flux by a sample when in the superconducting state.

The invention is further illustrated by the following examples in which temperatures are in degrees Celsius unless otherwise indicated. The chemicals (with purity indicated) used in the following examples of the process of this invention were $Ba(OH)_2.8H_2O$ - (>98%) obtained from Morton Thiokol Inc. or Research Organic/Inorganic Chemical Corp., $BaO_2$ - (99.5%) obtained from Atomergic Chemetals Corp., $Cu(C_2H_3O_2)_2.H_2O$ - (99.9%) obtained from J. T. Baker Chemical Co., $Cu(NO_3)_2.6H_2O$ - (99.999%) obtained from Johnson and Matthey Chemicals Ltd., $Y(C_2H_3O_2)_3.XH_2O$ (20.6% $H_2O$) - (99.9%) obtained from Morton Thiokol Inc., and $Y_2O_3$ - (99.9%) obtained from Alfa Research Chemicals and Materials, $Bi_2O_3$ - (99.8%) obtained from Alfa Research Chemicals and Materials, $Sr(OH)_2.8H_2O$ - (Technical Grade) obtained from Alfa Research Chemicals and Materials, and $Ca(OH)_2$ - (>96%) obtained from EM Science.

EXAMPLE 1

$Cu(C_2H_3O_2)_2.H_2O$ (14.37 g, 0.048 mole) was dissolved in 100 cc distilled water and the resulting solution was heated to about 75°. $Y(C_2H_3O_2).XH_2O$ (8.04 g, 0.024 mole) was dissolved in 25 cc distilled water and the resulting solution was heated to about 75°. These two solutions were combined to give a mixed solution containing copper and yttrium acetates to which 15.14 g $Ba(OH)_2.8H_2O$ was slowly added with stirring. The resulting reaction suspension slowly changed color from blue to greenish-black and finally to a blackish-brown. The suspension was kept stirred and heated at about 75° until a paste was obtained. This paste was further heated until dry to obtain a solid which was placed in a vacuum oven at 170° for 1 hour. The solid was then converted to a dark brown powder by hand grinding in an agate mortar and pestle. The X-ray diffraction pattern of this precursor solid showed that it was predominantly amorphous with some very poorly crystalline CuO also evident in the x-ray diffraction pattern. The yield was 25.90 g.

A 5.26 g portion of the above precursor was spread into a thin layer in an alumina tray and heated in air in a furnace from ambient temperature to a final heating temperature of 900° at a rate of about 20° per minute. The temperature was maintained at 900° for 2 hours. The furnace was then turned off and allowed to cool to a temperature below 100° before the sample was removed. The resulting product was black and the yield was 3.14 g. An X-ray diffraction powder pattern of the product showed that it was $YBa_2Cu_3O_x$. The indices of the observed reflections, the d-spacings and relative intensities are shown in Table I. These results indicate that the $YBa_2Cu_3O_x$ product has orthorhombic symmetry. A very slight trace amount of $BaCuO_2$ is also evident in the pattern.

Scanning electron micrographs of the powder revealed that it consisted of isotropic particles with dimensions ranging from about 0.2 µm to about 3 µm, with relatively little agglomeration.

Measurement of the Meissner effect showed the powder sample to have a $T_c$, a superconducting transition temperature, onset of about 90 K.

TABLE I

X-ray diffraction data for $YBa_2Cu_3O_x$

| | hkl | d(nm) | Intensity* |
|---|---|---|---|
| | 002 | 0.5786 | vvw |
| m | 003<br>100 | 0.3863 | |
| w | 012<br>102 | 0.3206 | |
| vs | 013<br>103<br>110 | 0.2720 | |
| vw | 111 | 0.2642 | |
| w | 112 | 0.2460 | |
| m | 005<br>104 | 0.2325 | |
| m | 113 | 0.2225 | |
| m | 020<br>006 | 0.1936 | |
| m | 200 | 0.1905 | |
| w | 115 | 0.1770 | |
| w | 016<br>023<br>106<br>120 | 0.1732 | |
| vw | 203<br>210<br>121<br>122 | 0.1711 | |
| | | 0.1660 | |
| ms | 123<br>116 | 0.1579 | |
| m | 213 | 0.1567 | |

*Legend:
s — strong
m — moderate
w — weak
v — very

EXAMPLE 2

A 1.08 g portion of the precursor powder prepared using a procedure very similar to that described in Example 1 was spread into a thin layer in an alumina tray and heated in air in a furnace from ambient temperature to a final heating temperature of 900° at a rate of about 20° per minute. The temperature was maintained at 900° for 30 minutes. The furnace was turned off and allowed to cool below 100° before the sample was removed. The product was black and the yield was 0.66 g. An X-ray diffraction powder pattern of the material showed that the product was orthorhombic $YBa_2Cu_3O_x$. The results were very similar to those given in Table I. There were also slight traces of $BaCuO_2$, $Y_2Cu_2O_5$ and $BaCO_3$.

Scanning electron micrographs of the powder showed that it was very similar in morphology to that described in Example 1. Measurement of the Meissner effect showed the powder sample to have a $T_c$ onset of about 90 K.

EXAMPLE 3

$Cu(C_2H_3O_2)_2.H_2O$ (28.75 g, 0.144 mole) was dissolved in 200 cc distilled water. The resulting solution was then heated to about 75°. $Ba(OH)_2.8H_2O$ (30.28 g, 0.096 mole) and 5.40 g of $Y_2O_3$ (0.024 mole) were then ground together, by hand, in an agate mortar with a pestle. The resulting solid mixture was then added to the heated copper acetate solution to obtain a suspension which was at first bright blue, but within 10 minutes had turned to dark greenish-black, and after another 10 minutes had turned a uniform black. The suspension was kept stirred and heated at about 75° until a paste was obtained. This paste was further heated until dry and the resulting solid was placed in a vacuum oven at 170° for 1 hour. The solid was then converted to a dark brown powder by hand grinding in an agate mortar using a pestle. The X-ray diffraction powder pattern of this precursor solid showed that the powder was amorphous with some poorly crystalline CuO and a small amount of a poorly crystalline unidentified phase also present. The yield was 46.51 g.

A 21.2 g portion of this precursor powder was spread into a thin layer in an alumina tray and heated in air in a furnace from ambient temperature to a final heating temperature of 900° at a rate of about 20° per minute. The temperature was maintained at 900° for 8 hours. The furnace was then turned off and allowed to cool to a temperature below 100° C. before the sample was removed. The product was black and the yield was 14.25 g. An X-ray diffraction powder pattern of the material showed that it was orthorhombic $YBa_2Cu_3O_x$, and the results were very similar to those given in Table I. Trace amounts of $BaCuO_2$ and $Y_2Cu_2O_5$ are also evident in the pattern.

Scanning electron micrographs of the powder showed that it was very similar in morphology to that described in Example 1. Measurement of the Meissner effect showed the powder sample to have a $T_c$ onset of about 90 K.

EXAMPLE 4

A 1.14 g of precursor powder made by a procedure very similar to that described in Example 3 was spread into a thin layer in an alumina tray and heated in air in a furnace from ambient temperature to a final heating temperature of 900° at a rate of about 20° per minute. The temperature was maintained at 900° for 2 hours. The furnace was then turned off and allowed to cool to a temperature below 100° C. before the sample was removed. The product was black. An X-ray diffraction powder pattern of the material showed that it was orthorhombic $YBa_2Cu_3O_x$, and the results were very similar to those given in Table I. Trace amounts of $BaCuO_2$ and $Y_2Cu_2O_5$ are also evident in the pattern.

Measurement of the Meissner effect showed the powder sample to have a $T_c$ onset of about 90 K.

EXAMPLE 5

$Cu(C_2H_3O_2)_2.H_2O$ (14.37 g, 0.072 mole) was dissolved in 100 cc distilled water, and the resulting solution was heated to about 75°. $Y(C_2H_3O_2)_3.XH_2O$ (8.04 g, 0.024 mole) was dissolved in 25 cc distilled water, and the resulting solution was also heated to about 75°. These two solutions were combined to give a mixed solution of copper and yttrium acetates to which 15.14 g (0.048 mole) of $Ba(OH)_2.8H_2O$ was slowly added with stirring. The resulting suspension slowly changed color from blue to greenish blue and finally to blackish-brown. The suspension was kept stirred and heated at about 75° for a little less than one hour. The heated suspension was then sprayed through an air atomization nozzle into a covered beaker containing liquid nitrogen. The nozzle, manufactured by Spraying Systems Co., Wheaton, Ill., was Model 9265-¼ J-LUC fitted with fluid cap #2850-LUC, liquid orifice diameter of 0.7 mm (0.028 in) and air cap #70-LUC. The nozzle was pressurized by 140 kPa (20 psi) of air. The resulting slurry of liquid nitrogen and finely divided frozen powder was then freeze dried. The powder obtained was medium grey and very fluffy. Its bulk density was 18 times lower than that of powder obtained by conventional evaporation of the solvent to dryness reflecting the extremely fine particle size and low degree of agglomeration in the freeze-dried powder. The yield was 23.9 g. An X-ray diffraction powder pattern of the material showed that the powder was almost totally amorphous with some very poorly crystalline CuO also present.

A 1.05 g portion of this freeze-dried powder was spread in a thin layer in an alumina tray and heated in air in a furnace from ambient temperature to a final heating temperature of 900° at a rate of about 20° per minute. The temperature was maintained at 900° for 2 hours. The furnace was turned off and allowed to cool below 100° before the sample was removed. The resulting powder was black and the yield is 0.61 g. An X-ray diffraction powder pattern of the material showed that the product was orthorhombic $YBa_2Cu_3O_x$, and the results were very similar to those given in Table I. There were a minor impurity of $Y_2Cu_2O_5$ and a trace amount of $Y_2BaCuO_5$. Measurement of the Meissner effect showed the powder to have a $T_c$ onset of about 90 K.

EXAMPLE 6

$Cu(C_2H_3O_2)_2.H_2O$ (11.50 g, 0.058 mole) was dissolved in 80 cc of distilled water, and the resulting solution was heated to about 75°. $Y(C_2H_3O_2).XH_2O$ (6.43 g, 0.019 mole) was dissolved in 25 cc of distilled water, and the resulting solution was also heated to about 75°. These two solutions were combined after which 12.11 g of $Ba(OH)_2.8H_2O$ (0.038 mole) were slowly added with stirring. The resulting suspension turned from dark blue, to greenish black, to black, all within about 20 min. The suspension was kept stirred and heated at about 75° for one hour. The heated suspension was then spray dried using a Buchi laboratory Model spray dryer operated with an inlet temperature of 215°. The resulting powder was a medium grey, free-flowing powder made up of spherical agglomerates, characteristic of the spray-drying process. The yield was 13.03 g.

A portion (1.25 g) of this precursor powder was spread into a thin layer in an alumina tray and then heated in air in a furnace from ambient temperature to a final heating temperature of 875° at a rate of about 20° per minute. The temperature was maintained at 875° for 2 hours. The furnace was turned off and allowed to cool below 100° before the sample was removed. The resulting product was black and the yield was 0.72 g. An X-ray diffraction powder pattern of the material showed that the product was orthorhombic $YBa_2Cu_3O_x$, and the results were very similar to those given in Table I. There were trace amounts of $BaCuO_2$ and $Y_2Cu_2O_5$.

EXAMPLE 7

$Cu(CHO_2)_2$ (11.06 g, 0.072 mole) was dissolved in 100 cc of distilled water with the aid of a few drops of formic acid. The resulting solution was heated to 75°. $(Ba(OH)_2.8H_2O$ (15.14 g, 0.048 mole) and 2.70 g of $Y_2O_3$ (0.012 mole) were ground together, by hand, using an agate mortar and pestle. The resulting solid mixture was then slowly added to the copper formate solution. The resulting suspension was kept stirred and heated at about 75° until a paste was obtained. This paste was further heated until dry and the resulting solid was placed in a vacuum oven at 170° for one hour. The solid was then converted to a black powder by hand-grinding using an agate mortar and pestle. The X-ray diffraction powder pattern of this precursor solid showed that it was a poorly crystalline unidentified phase or phases.

A portion (1.04 g) of this precursor powder was spread into a thin layer in an alumina tray and heated in air in a furnace from ambient temperature to a final heating temperature of 900° at a rate of about 20° per minute. The temperature was maintained at 900° for 2 hours. The furnace was turned off and allowed to cool below 100° before the sample was removed. The resulting product was black and the yield is 0.67 g. An X-ray diffraction powder pattern of the material showed that the product was orthorhombic $YBa_2Cu_3O_x$, and the results were very similar to those given in Table I. There were minor impurity phases of $BaCuO_2$ and $Y_2Cu_2O_5$.

EXAMPLE 8

$Cu(NO_3)_2.6H_2O$ (10.65 g, 0.036 mole) was dissolved in 25 cc of distilled water. $Y(NO_3)_3.6H_2O$ (5.39 g, 0.012 mole) was dissolved in 25 cc of $H_2O$. These two solutions were added together to yield a mixed solution of copper and yttrium nitrates which was then heated to about 75°. $Ba(OH)_2.8H_2O$ (7.57 g, 0.024 mole) was then slowly added with stirring to the heated solution. A light blue suspension was obtained. This suspension was kept stirred and heated at about 75° until a paste was obtained. This paste was further heated until dry and the resulting solid was placed in a vacuum oven at 170° for several hours. The solid was then converted to a light blue powder by grinding by hand using an agate mortar and pestle. An X-ray diffraction powder pattern of this precursor showed that it to consisted of a crystalline unidentified phase or phases. The yield was 14.69 g.

A portion (1.12 g) of this precursor powder was spread into a thin layer in an alumina tray and heated in air in a furnace from ambient temperature to a final heating temperature of 875° at a rate of about 20° per minute. The temperature was maintained at 875° for 2 hours. The furnace was turned off and allowed to cool substantially as described in previous examples. The resulting powder was black and the yield was 0.62 g. An X-ray diffraction powder pattern of the material showed that the product was orthorhombic $YBa_2Cu_3O_x$, and the results were very similar to those given in Table I. There were minor amounts of $BaCuO_2$ and CuO also present. Measurement of the Meissner effect showed the powder to have a $T_c$ onset of about 90 K.

EXAMPLE 9

$Cu(C_2H_3O_2)_2.H_2O$ (7.19 g, 0.036 mole) was dissolved in 50 cc of distilled water. The resulting solution was then heated to about 75°. $BaO_2$ (4.06 g, 0.024 mole) and 1.35 g of $Y_2O_3$ (0.006 mole) were ground by hand using an agate mortar and pestle. The resulting solid mixture was slowly added to the heated copper acetate solution. Addition had to be extremely slow since it is accompanied by the evolution of gas and foaming of the suspension. The resulting suspension eventually changed to a blackish-brown color. The suspension was kept stirred and heated at about 75° until a paste was obtained. This paste was further heated until dry to obtain a solid which was placed in a muffle furnace in air at 150° for about 16 hours. The solid was then converted to a dark brown powder by grinding it by hand using an agate mortar and pestle. The yield was 11.24 g.

A portion (1.11 g) of this precursor powder was spread into a thin layer in an alumina tray and heated in air in a furnace from ambient temperature to a final heating temperature of 875° at a rate of about 20° per minute. The temperature was maintained at 875° for 2 hours. The furnace was then turned off and allowed to cool substantially as described in the previous examples to give 0.76 g of a black product. An X-ray diffraction powder pattern of the product showed that it was orthorhombic $YBa_2Cu_3O_x$, and the results were very similar to those given in Table I. There were trace amounts of $BaCuO_2$, $Y_2Cu_2O_5$ and $BaCO_3$.

EXAMPLE 10

$Cu(C_2H_3O_2)_2.H_2O$ (7.294 g, 0.036 mole) was dissolved in 100 cc distilled water. The resulting solution was then heated to about 75° C. $Bi_2O_3$ (8.387 g, 0.018 mole), $Sr(OH)_2.8H_2O$ (9.007 g, 0.036 mole) and $Ca(OH)_2$ (1.363 g, 0.018 mole) were ground by hand using an agate mortar and pestle. The resulting solid mixture was slowly added to the heated copper acetate solution. The resulting suspension was initially bright blue but within five minutes changed to a blackish-brown color. The suspension was kept stirred and heated at about 75° C. until a dry solid was obtained. The solid was then converted to a dark brown powder by grinding it by using an agate mortar and pestle. The yield was 19.87 g. An X-ray diffraction powder pattern of this precursor solid showed that it was a crystalline unidentified phase or phases.

A portion (1.11 g) of this precursor powder was heated in air in a furnace from ambient temperature to a final heating temperature of 875° C. at a rate of about 20° C. per minute. The temperature was maintained at 875° C. for 2 hours. The furnace was then turned off and allowed to cool to a temperature below 100° C. before the sample was removed. The product was black and the yield was 0.79 g. An X-ray diffraction powder pattern of the product showed that it was the orthorhombic phase with the nominal formula $Bi_2Sr_2CaCu_2O_{8+y}$ plus a small amount of orthorhombic $Bi_2Sr_2CuO_{6+x}$. Measurement of the Meissner effect showed the powder to have a $T_c$ onset of about 72 K.

The sample was reground and then heated using essentially the same conditions used in the original heating described above. An X-ray diffraction powder pattern of the product showed even more orthorhombic phase with the nominal formula $Bi_2Sr_2CaCu_2O_{8+y}$ plus a reduced amount of orthorhombic $Bi_2Sr_2CuO_{6+x}$. Measurement of the Meissner effect showed the powder to have a $T_c$ onset of about 82 K.

EXAMPLE 11

$Cu(C_2H_3O_2)_2 \cdot H_2O$ (7.294 g, 0.036 mole) and $Tl(C_2H_3O_2)_3$ (6.867 g, 0.018 mole) are dissolved in 150 cc distilled water. The resulting solution was then heated to about 75° C. $Ba(OH)_2 \cdot 8H_2O$ (11.357 g, 0.036 mole) and $Ca(OH)_2$ (1.363 g, 0.018 mole) are ground by hand using an agate mortar and pestle. The resulting solid mixture is slowly added to the heated copper and thallium acetate solution. The suspension is kept stirred and heated at about 75° C. until a dry solid was obtained. The solid is then converted to a powder by grinding it by using an agate mortar and pestle. This precursor powder can then be heated in air in a furnace to a final heating temperature of about 850° C. to about 915° C. and maintained at that temperature for 15 minutes to 2 hours. The product will be the tetragonal phase with the nominal formula $Tl_2Ba_2CaCu_2O_{8+y}$.

The invention being claimed is:

1. A process for preparing a superconducting composition of the formula $$Bi_2Sr_2CuO_x$$

wherein x is a numerical value from about 6 to about 6.5, comprising
  (a) forming a suspension by either
    (i) mixing strontium hydroxide and $Bi_2O_3$ with an aqueous solution of a cupric carboxylate or cupric nitrate at a temperature from about 50° C. to about 100° C. or
    (ii) mixing strontium hydroxide with an aqueous solution of a cupric carboxylate or cupric nitrate and a bismuth carboxylate or bismuth nitrate at a temperature from about 50° C. to about 100° C. to obtain a suspension having Bi:Sr:Cu present in an atomic ratio of about 2:2:1.;
  (b) producing a powder precursor by (i) drying the suspension formed in step (a) by freeze-drying or spray-drying or (ii) further heating the suspension formed in step (a) to form a precursor solid and gently milling the precursor solid; and
  (c) heating the precursor powder in an oxygen-containing atmosphere at a temperature from about 850° C. to about 875° C. for a time sufficient to form $Bi_2Sr_2CuO_x$ powder.

2. The process of claim 1 wherein the suspension is formed by mixing strontium hydroxide and $Bi_2O_3$ with an aqueous solution of a cupric carboxylate.

3. The process of claim 2 wherein the cupric carboxylate is cupric acetate.

4. The process of claim 1 wherein the suspension is formed by mixing strontium hydroxide with an aqueous solution of a cupric carboxylate and a Bi-carboxylate.

5. The process of claim 4 wherein the cupric carboxylate is cupric acetate and the Bi-carboxylate is Bi-acetate.

6. A process for preparing a superconducting composition of the formula $$Bi_2Sr_2CaCu_2O_x$$

wherein x is a numerical value in the range from about 8 to 9, comprising
  (a) forming a suspension by either
    (i) mixing strontium hydroxide, calcium hydroxide and $Bi_2O_3$ with an aqueous solution of a cupric carboxylate or cupric nitrate at a temperature from about 50° C. to about 100° C. or
    (ii) mixing strontium hydroxide and calcium hydroxide with an aqueous solution of a cupric carboxylate of cupric nitrate and a bismuth carboxylate or bismuth nitrate at a temperature from about 50° C. to about 100° C. to obtain a suspension having Bi:Sr:Ca:Cu present in an atomic ratio of 2:2:1:2;
  (b) producing a powder precursor by (i) drying the suspension formed in step (a) by freeze-drying or spray-drying, or (ii) further heating the suspension formed in step (a) to form a precursor solid and gently milling the precursor solid; and
  (c) heating the precursor powder in an oxygen-containing atmosphere at a temperature from about 850° C. to about 875° C. for a time sufficient to form $Bi_2Sr_2CaCu_2O_x$ powder.

7. The process of claim 6 wherein the suspension is formed by mixing strontium hydroxide, calcium hydroxide and $Bi_2O_3$ with an aqueous solution of a cupric carboxylate.

8. The process of claim 7 wherein the cupric carboxylate is cupric acetate.

9. The process of claim 6 wherein the suspension is formed by mixing strontium hydroxide and calcium hydroxide with an aqueous solution for a cupric carboxylate and a Bi-carboxylate.

10. The process of claim 9 wherein the cupric carboxylate is cupric acetate and the Bi-carboxylate is Bi-acetate.

11. A process for preparing a superconducting composition of the formula $$Tl_2Ba_2CuO_x$$

wherein x is a numerical value in the range from about 6 to about 6.5, comprising
  (a) forming a suspension by either
    (i) mixing barium hydroxide and $Tl_2O_3$ with an aqueous solution of a cupric carboxylate or cupric nitrate at a temperature from about 50° C. to about 100° C. or
    (ii) mixing barium hydroxide with an aqueous solution of a cupric carboxylate or cupric nitrate and a thallium carboxylate or thallium nitrate at a temperature from about 50° C. to about 100° C., to obtain a suspension having Tl:Ba:Cu present in an atomic ratio of about 2:2:1;
  (b) producing a powder precursor by (i) drying the suspension formed in step (a) by freeze-drying or spray-drying, or (ii) further heating the suspension formed in step (a) to form a precursor solid and gently milling the precursor solid; and
  (c) heating the precursor powder in an oxygen-containing atmosphere at a temperature from about 850° C. to about 920° C. for a time sufficient to obtain $Tl_2Ba_2CuO_x$ powder.

12. The process of claim 11 wherein the suspension is formed by mixing barium hydroxide and $Tl_2O_3$ with an aqueous solution of a cupric carboxylate.

13. The process of claim 12 wherein the cupric carboxylate is cupric acetate.

14. The process of claim 11 wherein the suspension is formed by mixing barium hydroxide with an aqueous solution of a cupric carboxylate and a Tl-carboxylate.

15. The process of claim 14 wherein the cupric carboxylate is cupric acetate and the thallium carboxylate is thallium acetate.

16. A process for preparing a superconducting composition of the formula $$Tl_2Ba_2CaCu_2O_x$$

wherein x is a numerical value in the range from about 8 to about 9 or $$Tl_2Ba_2Ca_2Cu_3O_x$$

wherein x is a numerical value in the range from about 10 to about 11.5, comprising (a) forming a suspension by either
  (i) mixing barium hydroxide, calcium hydroxide and $Tl_2O_3$ with an aqueous solution of a cupric carboxylate or cupric nitrate at a temperature from about 50° C. to about 100° C. or
  (ii) mixing barium hydroxide and calcium hydroxide with an aqueous solution of a cupric carboxylate or cupric nitrate and a thallium carboxylate or thallium nitrate at a temperature from about 50° C. to about 100° C. to obtain a suspension having Tl:Ba:Cu:Cu present in an atomic ratio of about 2:2:1:2 or 2:2:2:3;

(b) producing a powder precursor by (i) drying the suspension formed in step (a) by freeze-drying or spray-drying or (ii) further heating the suspension formed in step (a) to form a precursor solid and gently milling the precursor solid; and (c) heating the precursor powder in an oxygen-containing atmosphere at a temperature from about 850° C. to about 920° C. for a time sufficient to obtain $Tl_2Ba_2CaCu_2O_x$ or $Tl_2Ba_2Ca_2Cu_3O_x$ powder.

17. The process of claim 16 wherein the suspension is formed by mixing barium hydroxide, calcium hydroxide and $Tl_2O_3$ with an aqueous solution of a cupric carboxylate.

18. The process of claim 17 wherein the cupric carboxylate is cupric acetate.

19. The process of claim 16 wherein the suspension is formed by mixing barium hydroxide and calcium hydroxide with an aqueous solution of a cupric carboxylate and a Tl-carboxylate.

20. The process of claim 19 wherein the cupric carboxylate is cupric acetate and the Tl-carboxylate is Tl-acetate.

* * * * *